United States Patent [19]

Rosier et al.

[11] 4,204,154
[45] May 20, 1980

[54] PORTABLE DEVICE FOR USE IN STARTING AIR-START UNITS FOR AIRCRAFT AND HAVING CABLE LEAD TESTING CAPABILITY

[76] Inventors: Robert A. Frosch, Administrator of the National Aeronautics and Space Administration, with respect to an invention of William R. Rosier, Tracy; George G. Volk, Lancaster, both of Calif.

[21] Appl. No.: 885,066

[22] Filed: Mar. 9, 1978

[51] Int. Cl.² ............................................. G01R 31/02
[52] U.S. Cl. ........................................................ 324/51
[58] Field of Search ........................ 324/51, 66, 73 R; 340/650–652

[56] References Cited

U.S. PATENT DOCUMENTS

| | | | |
|---|---|---|---|
| 2,221,556 | 11/1940 | Roemisch | 324/73 R |
| 2,840,781 | 6/1958 | Ragonese | 324/51 |
| 2,858,507 | 10/1958 | Liautaud et al. | 324/51 X |
| 2,904,750 | 9/1959 | Gargani et al. | 324/51 |
| 3,543,111 | 11/1970 | Harris et al. | 324/51 X |
| 3,590,373 | 6/1971 | Lake | 324/51 X |
| 3,663,939 | 5/1972 | Olsson | 324/51 X |
| 3,737,767 | 6/1973 | Slutsky | 324/51 |
| 3,753,088 | 8/1973 | Ettelman | 324/51 |
| 3,818,329 | 6/1974 | Reaves | 324/51 |
| 4,037,220 | 7/1977 | Beyersdorf | 324/51 X |

*Primary Examiner*—Gerard R. Strecker
*Attorney, Agent, or Firm*—Monte F. Mott; John R. Manning; Paul F. McCaul

[57] ABSTRACT

A device including a lead testing and motor starting circuit characterized by a direct current voltage source, a pair of terminal plugs connected with the circuit, each being characterized by a first, second, and third terminal, a pair of manually operable switches for connecting the first terminal of each plug of the pair to the positive side of the voltage source, a circuit lead connecting to the second terminal of each plug the negative side of said source, a pair of electrical cables adapted to connect said first and second terminals of each plug to an air-start unit, and means for connecting each cable of the pair of cables between the first terminal of one plug and the third terminal of the other plug of the pair, and a second pair of manually operable switches for selectively connecting the third terminal of each plug of the pair to the negative side of the voltage source, whereby the electrical continuity of each cable of the pair may be examined prior to being connected to an air-start unit.

1 Claim, 5 Drawing Figures

PORTABLE DEVICE FOR USE IN STARTING AIR-START UNITS FOR AIRCRAFT AND HAVING CABLE LEAD TESTING CAPABILITY

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

1. Field of the Invention

The invention generally relates to a portable device including a utility circuit particularly suited for use in starting air-start units provided for starting aircraft engines and the like.

2. Description of the Prior Art

Heretofore, in starting aircraft engines such as those employed by the 747 aircraft, it has been common practice to connect thereto starting systems comprising air-start units such as a gas turbine or diesel compressors, herein referred to as "air-start units", usually arranged in pairs. Such systems require that an operator be employed for starting each of the air-start units. As can be appreciated, this requires that undesirable amounts of operator time be devoted to starting procedures. Moreover, in instances where a malfunction of an air-start unit is experienced, difficulty often is encountered in determining the source of the malfunction with an attendant delay of launch and loss of valuable time in terms of aircraft operation and crew utilization, to say nothing of the consequential reduction in mission capability and/or passenger inconvenience.

Therefore, it should be apparent that there currently exists a need for a practical device which can readily be employed in starting operations for starting aircraft engines requiring a use of air-start units, as well as be employed in conducting trouble-shooting investigations for determining sources of malfunction for such units.

It is therefore the general purpose of the instant invention to provide a portable device including a utility circuit particularly suited for use in initiating operation of air-start units for aircraft engines.

OBJECTS AND SUMMARY OF THE INVENTION

It is therefore an object of the instant invention to provide in a portable device an improved portable utility circuit.

It is another object to provide in a portable device a utility circuit for facilitating simultaneous initiation of operations for multiple aircraft engines.

It is another object to provide in a portable device a utility circuit particularly suited for use in initiating simultaneous operation of a plurality of air-start units provided for starting the engines of aircraft characterized by a capability for examining the electrical continuity of cables employed in simultaneously connecting the circuit to the air-start unit.

Another object is to provide in a portable device an improved utility circuit including a pair of subcircuits particularly suited for use in simultaneously initiating operation of a pair of air-start units, although not necessarily restricted in use thereto, since the subcircuit components of the circuit may be repeated for providing the circuit with a capability for simultaneously initiating operation of more than a pair of air-start units.

These and other objects and advantages are achieved through the use of a device having a utility circuit mounted in a portable housing and connectable through a plurality of cables to multiple air-start units, while having a capability for facilitating rapid examination of electrical continuity for cables employed in connecting the circuit with the air-start units, as will become more readily apparent by reference to the following description and claims in light of the accompanying drawings.

DESCRIPTION OF THE PREFERRED EMBODIMENT

Figure 1:
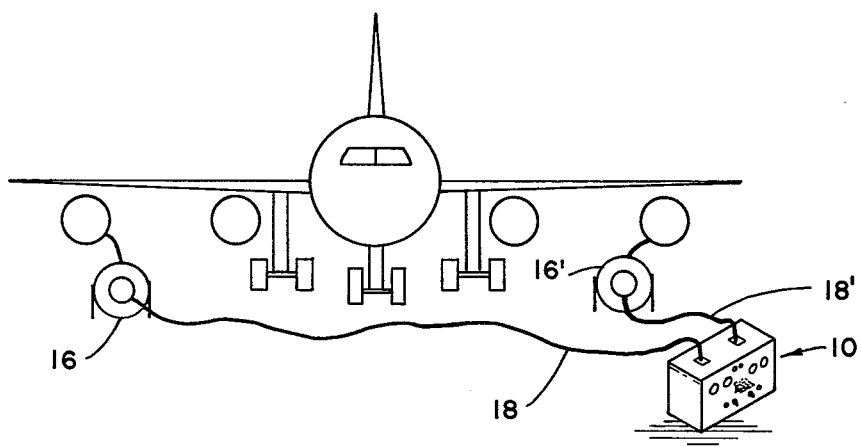
FIG. 1 is a pictorial view illustrating an operational environment for a device embodying the principles of the instant invention.
Figure 2:
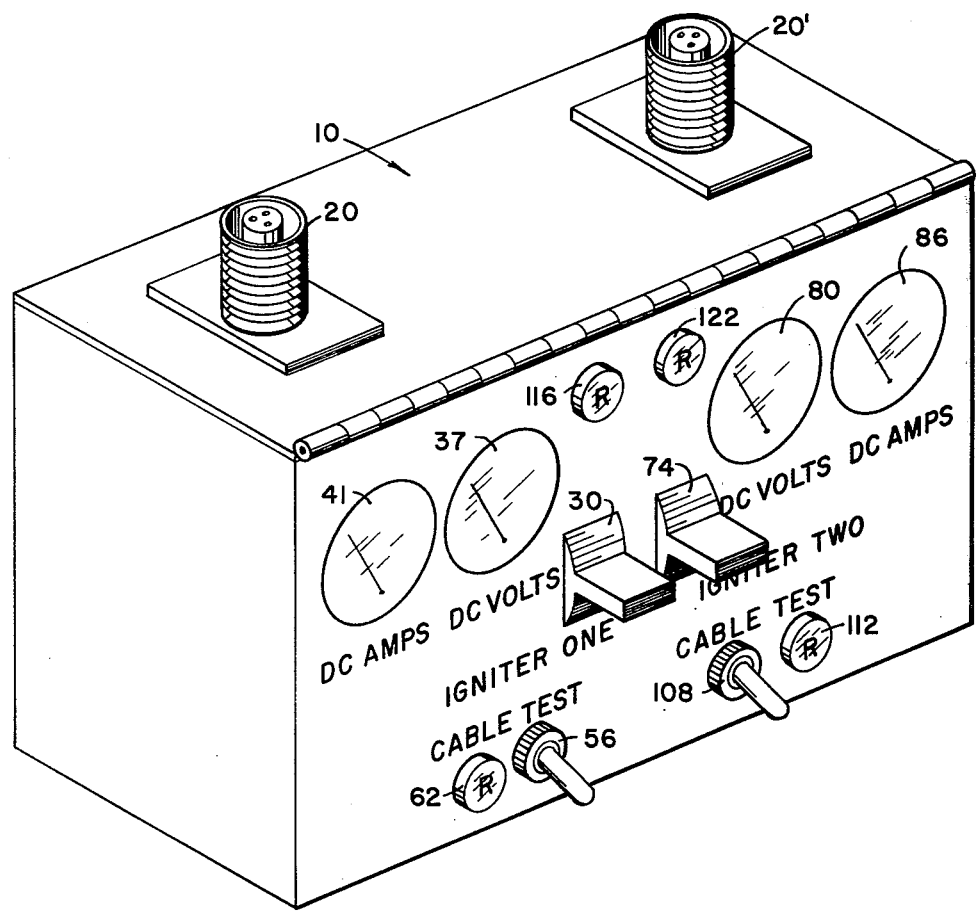
FIG. 2 is a perspective view of the device.

Referring now to the drawings with more particularity, wherein like reference characters designate like or corresponding parts throughout the several views, there is shown in FIG. 1 a device embodying the principles of the instant invention.

Figure 3:
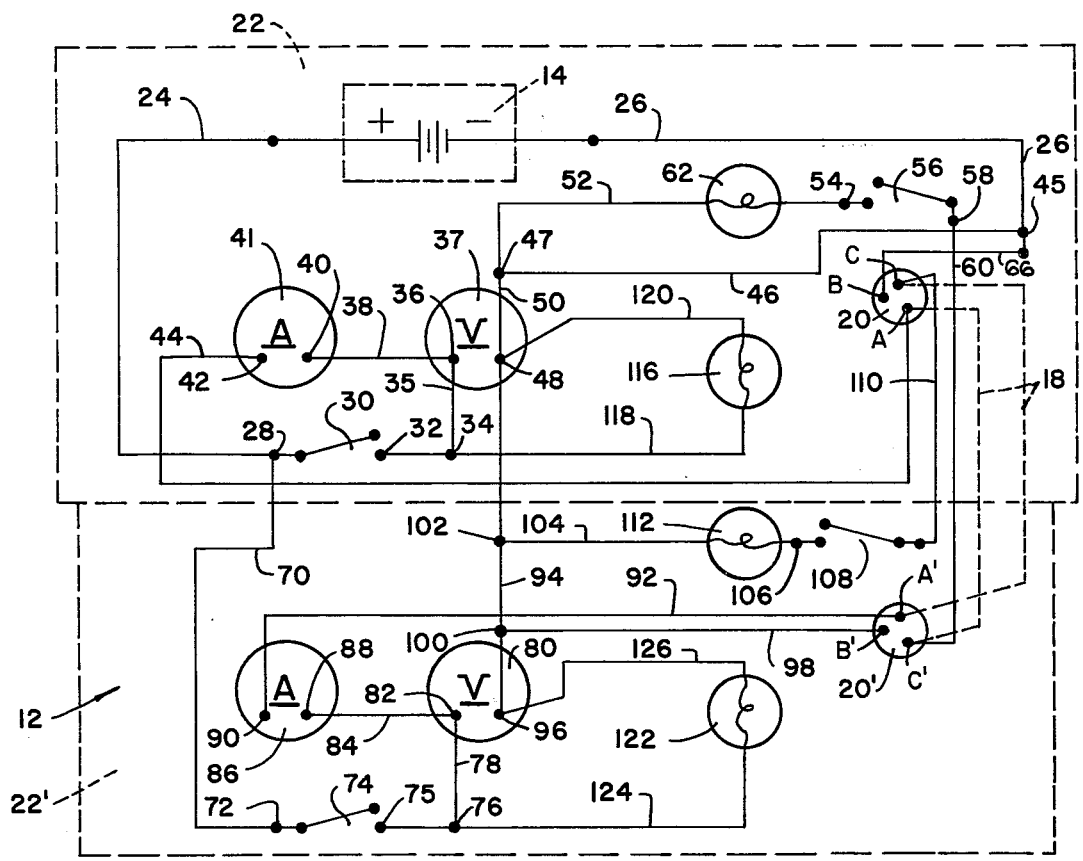
FIG. 3 is a schematic view illustrating a circuit provided for the device of the instant invention.

As shown, the device includes a portable housing 10 within which is mounted a circuit 12, more clearly illustrated in FIG. 3. The circuit 12 preferably includes a self-contained voltage source, designated 14, the potential of which is adequate for the intended purposes of the device, currently, a 24-volt D.C. battery is employed.

As shown in FIG. 1, the circuit is connected across throttle and/or air valve, not designated, provided for initiating operation of a pair of air-start units designated 16 and 16'. The connection is effected between the circuit 12 and the air-start units through a use of a pair of removable cables designated 18 and 18', each having at least a positive and a negative lead, not designated, included therein. Cannon plugs 20 connected with the circuit 12 are mounted on the housing 10 for facilitating a coupling of the cables therewith. The air-start units designated 16 and 16' comprise starting units which in operation are connected to the engines, not designated, for a given aircraft in order to start or initiate operation of the engines preparatory to take-off.

Since the air-start unit 16 and 16' form no specific part of the instant invention, a detailed description thereof is omitted in the interest of brevity. It suffices to understand that the circuit 12, mounted in the housing 10, is employed in initiating operation of the air-start units and that these units, in turn, initiate operation of the aircraft engines connected thereto. Consequently, it can be appreciated that the circuit 12 facilitates simultaneous initiation of operations of multiple air-start units, by a sole operator. Moreover, in view of the fact that a malfunction of the cable necessarily results in the failure of an air-start unit, the circuit 12 also serves to expedite trouble-shooting, either prior to attempting a "start" or subsequent to a failure to achieve a start, in a manner which will hereinafter become more readily apparent.

It is important to note that the cannon plugs 20 and 20' are of similar design and are provided with suitable receptacles, not shown, for receiving probes provided at each of the opposite ends of each of the cables 18 and 18'. As a practical matter, it is to be understood that the configuration of the cannon plugs 20 and 20' may be varied, depending upon the configuration of the probes and the nature of the device with which the circuit is to be connected. Since the purpose of the plugs 20 and 21' simply is to afford a connection of the cables 18 and 18' with the circuit 12, a detailed description of the specific plug employed is omitted in the interest of brevity. However, it is important to note that plugs 20 and 20' include at least three terminals, designated A, B, and C and A', B', and C', respectively, adapted to be connected independently to mating terminals for a cable in a conventional manner.

As best illustrated in FIG. 3, the circuit 12 includes a first subcircuit 22 and a second subcircuit 22'. The subcircuits 22 and 22' are similarly configured and may be repeated to provide as many subcircuits as desired.

As shown in the drawings, the subcircuit 22 includes a first lead 24 connected with the positive terminal, not designated, of the voltage source 14 while a second lead 26 is connected with the negative side of the voltage source 14. These leads serve to connect the subcircuit 22 and 22' across the voltage source.

The lead 24, as shown, terminates at junction terminal 28. To the terminal 28, there is connected a normally-open switch 30 having a contact 32 connected with a junction terminal 34. Consequently, once the switch 30 is closed the positive terminal of voltage source 14 is connected with the junction terminal 34.

From the junction terminal 34 there is extended a lead 35 which serves to connect thereto a terminal 36. As a practical matter, the terminal 36 is provided for connecting the positive side of a volt meter 37 in series with the switch 30. Since this volt meter is of a known and suitable design, a detailed discussion of the volt meter is omitted in the interest of brevity.

From the terminal 36 there is extended a lead 38 which serves to connect a terminal 40 for an ammeter 41 with the terminal 36 and, hence, the switch 30. Like the volt meter 37, the ammeter 41 is of a known and suitable design. Therefore, a detailed description of the ammeter also is omitted in the interest of brevity.

At the opposite side of the ammeter there is provided a terminal 42 connected to a lead 44 which extends from the ammeter 41 to terminal contact, designated A, for the cannon plug 20. Hence, with the switch 30 in a closed configuration a circuit is completed from the positive side of the voltage source 14 through the ammeter 41 to the terminal contact A so that the amperage of a current flowing to terminal A, through the lead 44, can be readily determined.

It is important, also, to note that the lead 26 extends from the negative side of the voltage source 14 to a junction terminal 45. From the terminal 45 there extends a lead 46 which serves to connect with the terminal 45 a junction terminal 47, while the negative side of the volt meter 37 is connected to the junction terminal 47, at its negative terminal 48, through a lead 50. Hence, when the switch 30 is closed the voltage source 14 is connected across the volt meter 37 whereupon the value of the voltage applied to terminal A is indicated.

Also connected to the negative side of the voltage source 14, at the terminal 47, is a lead 52 which extends to one contact 54 for a normally-open switch 56. Hence, a negative voltage is continuously applied to one side of the switch 56, at its terminal 54. To the opposite side of the switch 56, at a terminal 58, there is connected a lead 60 which extends to a terminal designated C' for the cannon plugs 20'. Consequently, with the switch 56 in a closed configuration, a negative potential is applied to the terminal C', through the lead 60.

For purposes of indicating the presence of a flow of current through the lead 60, to the terminal C', there is connected within the lead 52 a lamp 62 of suitable size. As a practical matter, where desired, a protective shunt, not shown, is provided for the lamp 62. Finally, it is important to note that terminal B, for the plug 20, also is connected to the negative side of the voltage source 14 through a lead 66 connecting this terminal with the terminal 45.

In view of the foregoing, it should be apparent that upon a closing of the switch 30, a positive potential appears at terminal A, while a negative potential appears at terminal B. Thus a connection of the voltage source 14 across a throttle and/or air valve for the air-start unit 16, through cable 18, is facilitated. Furthermore, upon the closing of the switch 56, a negative potential also appears at the terminal C' of the plug 20', for purposes of facilitating a rapid examination of the electrical continuity for a cable 18, or 18', as will hereinafter become more readily apparent.

With reference to subcircuit 22', it is to be noted that to the junction terminal 28 there also is connected a positive voltage supply lead 70 for the subcircuit 22'. The lead 70 connects to the terminal 28 a terminal 72 provided for a normally-open switch 74. Thus the switch 74 is connected to the positive side of the voltage source 14. Also connected to the switch 74, at a contact 75, is a junction terminal 76 from which extends a lead 78. This lead serves to connect the junction terminal 76 to a volt meter 80, at its positive terminal 82.

From the terminal 82, there extends a lead 84 which connects with an ammeter 86, at its input terminal 88. Thus the ammeter 86 is connected to the junction terminal 76. The opposite terminal, designated 90, for the ammeter 86 is connected through a lead 92 to an output terminal, designated A' for the plug 20'. Thus the terminal A' is connected to the junction terminal 76. Consequently, a closing of the switch 74 serves to connect the output terminal A' of the plug 20' with the positive side of the voltage source 14. Further, it will be apparent that any current flowing through the lead 92 to the terminal A' is indicated at the ammeter 86.

It is important to note that a lead 94 also is provided to connect the volt meter 80, at its terminal 96, with the terminal 48 for the volt meter 37. Consequently, a negative potential continuously is applied from the terminal 45 to the terminal 96. Hence, once the switch 74 is closed, the potential of the voltage source 14 is applied across the volt meter 80, at the terminals 82 and 96, for thus providing intelligence indicative of the value of the voltage source 14.

In practice, a lead 98 is provided for connecting the output terminal B' of the plug 20' with the lead 94, at terminal 100, so that a negative potential continuously is applied to the output terminal B' of the plug 20'.

Also, connected to the lead 94, at terminal 102, is a lead 104 which connects a terminal 106 for a switch 108 to the negative side of the voltage source 14, via the lead 94. Hence, a negative potential continuously is applied to one side of the switch 108 at the terminal 106. The switch 108 also is connected to terminal C for the plug 20, via a lead 110. Consequently, upon closing of the switch 108 a negative potential is applied to the output terminal C of the output plug 20.

Where desired, an indicator lamp 112 is connected in the lead 104 for purposes of indicating the presence of current in the lead 104. As in the case with the lamp 62, where desired, the lamp 116 is protected by a shunt, not shown.

It also is now important to note that where it becomes desirable to provide for a detection of the existence of a current flowing through leads 24 and 70 of subcircuits 22 and 22', to the switches 30 and 74, respectively, there is provided, in subcircuit 22, a lamp 116 connected between the terminals 34 and 48, by leads 118 and 120, respectively. Consequently, when the switch 30 is closed, voltage is applied across the lamp 116.

Similarly, a lamp 122 is connected between the terminals 76 and 96 via leads 124 and 126, so that once the switch 74 is closed a voltage is applied across the lamp 122 for thus causing the lamp to illuminate for thereby indicating the existence of a current flow through the circuit.

It should now be apparent that the output terminals B and B', for the plugs 20 and 20', are connected directly to the negative side of the voltage source 14 so that these terminals continuously remain at the negative potential of the voltage source. It should also be apparent that upon a closing of the switches 30 and 74 a positive potential is applied to the terminals A and A' of the output plugs 20 and 20', respectively. Where a current is caused to flow from terminals A and A', a current flow is established through the ammeters 41 and 86. Similarly, it should be apparent that upon a closing of the switches 56 and 108 the negative potential is applied from the voltage source 14 to the output terminals C and C' of the plugs 20 and 20'.

Figure 4:
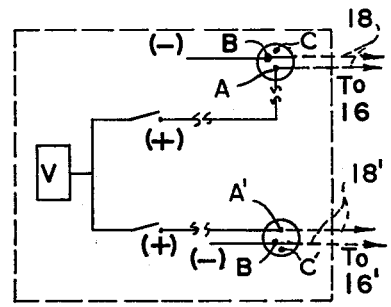
FIG. 4 is a fragmented schematic view illustrating one manner in which the device is employed.

It should now be understood that, as illustrated in FIG. 4, upon a coupling of the cables 18 and 18' to the plugs 20 and 20', it becomes possible to apply a voltage across the throttle and/or air valve of the air-start units 16 and 16' in order to effect an initiation of operation of the air-start units. Moreover, both of the air-start units 16 and 16' preferably are controlled by a single operator employing the portable housing 10 at a suitable location in the vicinity of an aircraft, the engines of which are to be started.

Figure 5:
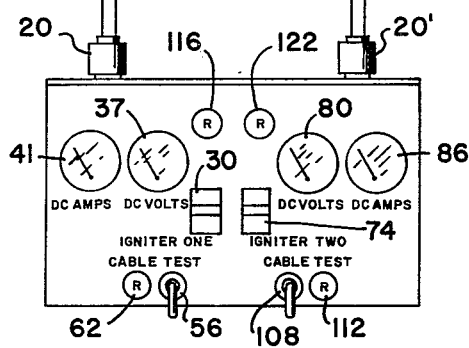
FIG. 5 is a front elevational view of the device depicting another manner in which the device is employed.

In the event an air-start unit experiences a malfunction, loss of electrical continuity for the related cable becomes a prime consideration. In order to examine the suspected cable for electrical continuity, it is necessary only to connect the end of the cable previously connected to the malfunctioning air-start unit to the opposite plug, 20 or 20' as the case may be, included within the circuit 12. For example, in the event it becomes desirable to determine whether a voltage is being applied across the throttle and/or air valve from the output terminals A and B of the plug 20, the end of the cable 18 attached to the air-start unit 16 is removed and attached to the plug 20', as indicated in FIG. 5. When the cable is so configured, the terminal A is connected with terminal C' and terminal C is connected to terminal A' of plug 20', as indicated by the dashed line in FIG. 3. A closing of the switches 30 and 56, of the subcircuit 22, causes a positive potential to be applied at A as a negative potential is applied at C'. A flow of current from A to C' is then indicated as the lamp 62 becomes illuminated. Should the lamp 62 fail to become illuminated, it can be assumed that electrical continuity between the output terminals A and C' for the plugs 20 and 20', respectively, has been interrupted and the problem can be solved simply by replacing the faulty cable.

A similar examination of the cable can be made in a similar fashion for determining electrical continuity for the other lead of the cable 18. Here, the other lead of the cable 18 is connected between the output terminal A', of the plug 20', and the output terminal C of the plug 20, respectively, as previously mentioned. Therefore, simply by closing the switch 74, in order to assure application of a positive potential to the terminal A', and closing the switch 108, for assuring that a negative potential is applied to the output terminal C, a flow of current is established between the output terminals A' and C. Illumination of the lamp 112 indicates circuit continuity for the cable 18. Again, in the event the lamp 112 fails to become illuminated, it can be assumed that electrical continuity has been interrupted between the output terminals A' and C. The leads of the cable 18' can be examined in substantially the same manner hereinbefore discussed, in which the leads of the cable 18 are examined.

Finally, in order to avoid the likelihood that a cable malfunction will be encountered during "start-up" operations, a cable testing operation is performed preparatory to connecting the cables to the air-start units.

In view of the foregoing, it should readily be apparent that the device which embodies the principles of the instant invention provides a practical solution to the perplexing problems of accurately and rapidly effecting air-start of aircraft engines, preparatory to launch.

Although the invention has been herein shown and described in what is conceived to be the most practical and preferred embodiment, it is recognized that departures may be made therefrom within the scope of the invention, which is not to be limited to the illustrative details disclosed.

What is claimed is:

1. In a portable device particularly suited for use in initiating operation of air-start units for aircraft, an improved circuit comprising:
   A. a D. C. voltage source including a positive and a negative terminal;
   B. a pair of terminal plugs, each plug of said pair being characterized by a first, second and third terminal, the second terminal of each plug being connected in series with the negative terminal of the voltage source;
   C. a pair of subcircuits, each subcircuit of said pair of subcircuits comprising a first normally open switch connected to the positive terminal of said voltage source, means including a lead for connecting the first terminal of one plug of said pair in series with said first switch, whereby a positive voltage is applied to said first terminal of said one plug when said first switch is closed, amperage measuring means interconnected in series between said first switch and the first terminal of said one plug, and voltage measuring means connected between the negative terminal and said first switch for measuring voltages applied across said first switch when the switch is closed;
   D. means including a pair of electrical cables, each including a first lead for connecting the first terminal of one plug to one side of an air-start unit and a second lead for connecting the second terminal of said one plug to the other side of the air-start unit, whereby a voltage is applied across said air-start unit in response to a closing of said first normally open switch; and E. means for examining the electrical continuity of the leads of each cable of said pair of cables including within said first and second subcircuit test circuit means for connecting the third terminal of each plug to the negative terminal of said voltage source, each of said test circuit means including a second normally open switch interposed in series between the negative terminal of the voltage source and the third terminal of one plug of said pair and a lamp connected in series between the second normally open switch and the negative terminal, whereby a circuit is completed through said lamp, between the negative terminal of the voltage source and the third terminal of the one plug upon closing of said second normally open switch, said third terminal of each plug being adapted to receive in electrically connected relation one end of one lead of one cable of said pair of cables so that the first terminal of each plug of said pair of plugs may be connected to the third terminal of the other plug of the pair simultaneously, in order that a voltage may be applied across each lead of said pair in response to a simultaneous closing of the first and second normally open switches of the subcircuits of said pair of subcircuits, and the flow of current therethrough detected at said lamps and measured at the amperage measuring means of said subcircuits.

* * * * *